US008105735B2

(12) United States Patent
Kinoshita

(10) Patent No.: US 8,105,735 B2
(45) Date of Patent: Jan. 31, 2012

(54) REFLECTIVE MASK BLANK FOR EUV LITHOGRAPHY AND REFLECTIVE MASK FOR EUV LITHOGRAPHY

(75) Inventor: Takeru Kinoshita, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/878,202

(22) Filed: Sep. 9, 2010

(65) Prior Publication Data

US 2010/0330470 A1    Dec. 30, 2010

Related U.S. Application Data

(63) Continuation of application No. PCT/JP2009/054942, filed on Mar. 13, 2009.

(30) Foreign Application Priority Data

Apr. 23, 2008 (JP) ................................ 2008-112763

(51) Int. Cl.
G03F 1/00 (2006.01)
(52) U.S. Cl. .......................................................... 430/5
(58) Field of Classification Search ........ 430/5; 428/428, 428/430; 378/35
See application file for complete search history.

(56) References Cited

U.S. PATENT DOCUMENTS

| 5,485,497 A | 1/1996 | Oizumi et al. |
| 7,282,305 B2 * | 10/2007 | Shoki et al. .................. 430/5 |
| 7,390,596 B2 | 6/2008 | Ishibashi et al. |
| 2006/0095208 A1 | 5/2006 | Hirscher et al. |

FOREIGN PATENT DOCUMENTS

| JP | 06-120125 | 4/1994 |
| JP | 2004-006798 | 1/2004 |
| JP | 2005-101399 | 4/2005 |
| JP | 2006-128705 | 5/2006 |
| JP | 2006-179553 | 7/2006 |
| JP | 2007-273656 | 10/2007 |

* cited by examiner

Primary Examiner — Stephen Rosasco
(74) Attorney, Agent, or Firm — Oblon, Spivak, McClelland, Maier & Neustadt, L.L.P.

(57) ABSTRACT

To provide an EUV mask of which a decrease in the contrast of reflected light at the mask pattern boundary, particularly a decrease in the contrast of reflected light at the boundary on the mask pattern outer edge, is suppressed, and an EUV mask blank to be used for production of the EUV mask.
A reflective mask blank for EUV lithography, comprising:
a substrate, and a reflective layer to reflect EUV light, and an absorber layer to absorb EUV light, formed in this order over the substrate,
a step on at least a part of the substrate being provided between a first portion where the absorber layer is removed at the time of patterning, and a second portion where the absorber layer is not removed at the time of patterning, adjacent to the first portion where the absorber layer is removed.

13 Claims, 4 Drawing Sheets (a)

(b)

(c)

*1: INTENSITY I OF REFLECTED LIGHT
*2: INTENSITY OF SCATTERED LIGHT
*3: INTENSITY S OF REFLECTED LIGHT (a)

(b)

(c)

REFLECTIVE MASK BLANK FOR EUV LITHOGRAPHY AND REFLECTIVE MASK FOR EUV LITHOGRAPHY

TECHNICAL FIELD

The present invention relates to a reflective mask blank (in this specification, hereinafter referred to as "EUV mask blank") for EUV (Extreme Ultra Violet) lithography to be used for e.g. production of semiconductors, and a reflective mask for EUV lithography (in this specification, hereinafter referred to as "EUV mask") obtained by patterning the EUV mask blank.

BACKGROUND ART

In the semiconductor industry, a photolithography method using visible light or ultraviolet light has been employed as a technique for writing, on a Si substrate or the like, a fine pattern, which is required for forming an integrated circuit comprising such a fine pattern. However, the conventional photolithography method has been close to the resolution limit, while microsizing of semiconductor devices has been accelerated. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, is considered to be promising as an exposure technique for 45 nm or below. In this specification, "EUV light" means a ray having a wavelength in a soft X-ray region or a vacuum ultraviolet ray region, specifically a ray having a wavelength of from about 10 to 20 nm, in particular, of about 13.5 nm±0.3 nm.

EUV light is apt to be absorbed by any substances and the refractive indices of substances are close to 1 at this wavelength, whereby it is impossible to use a dioptric system like a conventional photolithography employing visible light or ultraviolet light. For this reason, for EUV light lithography, a catoptric system, i.e. a combination of a reflective photomask and a mirror, is employed.

A mask blank is a stacked member for fabrication of a photomask, which has not been patterned yet. In the case of an EUV mask blank, it has a structure wherein a substrate made of glass or the like has a reflective layer to reflect EUV light and an absorber layer to absorb EUV light, formed thereon in this order (Patent Document 1).

In an EUV mask blank, the absorber layer had better be thin. In EUV lithography, the exposure light is not applied from the direction vertical to the EUV mask, but is applied from a direction inclined to the vertical direction by several degrees, usually 6°. If the absorber layer is thick, in EUV lithography, a shadow by the exposure light is cast on a mask pattern formed by removing a part of the absorber layer by patterning, whereby the shape accuracy and the dimensional accuracy of a mask pattern (hereinafter referred to as "transfer pattern") to be transferred on a resist on a substrate such as a Si wafer by using the EUV mask will be deteriorated. This problem is more remarkable as the line width of a mask pattern formed on the EUV mask becomes smaller, and accordingly further reduction in the thickness of the absorber layer of the EUV mask blank has been expected.

Patent Document 1: JP-A-2004-6798 (U.S. Pat. No. 7,390,596)

DISCLOSURE OF THE INVENTION

Problems to be Solved by the Invention

For the absorber layer of an EUV mask blank, a material having a high absorption coefficient for EUV light is used, and its thickness is ideally such that when the surface of the absorber layer is irradiated with EUV light, the entire EUV light is absorbed in the absorber layer. However, as described above, it has been required to reduce the thickness of the absorber layer, and accordingly not the entire EUV light can be absorbed in the absorber layer, and a part thereof is reflected.

It is a contrast of reflected light on the EUV mask, i.e. a contrast between reflected light from a portion where the absorber layer is removed by patterning so that the reflective layer is exposed and reflected light from a portion where the absorber layer is not removed at the time of patterning, that is required when a transfer pattern is formed on a resist on a substrate by EUV lithography. Accordingly, it has been considered that there are not any problems even if not the entire EUV light is absorbed in the absorber layer so long as the contrast of the reflected light can be sufficiently secured.

However, the present inventors have found that so long as the state of irradiation with the exposure light in EUV lithography such that the exposure light is applied from a direction inclined to the vertical direction by several degrees is taken, a decrease in the contrast of reflected light at a mask pattern boundary, and resulting deterioration in the shape accuracy and the dimensional accuracy of a transfer pattern is inevitable with a conventional EUV mask. This point will be described with reference to drawings. In this specification, the mask pattern boundary means a boundary between a portion where the absorber layer is removed by patterning so that the reflective layer is exposed (absorber layer removed portion) and a portion where the absorber layer is not removed at the time of patterning (absorber layer unremoved portion), adjacent to the absorber layer removed portion.

FIG. 7(a) is a view schematically illustrating one embodiment of an EUV mask, and illustrates a state where an EUV mask is irradiated with exposure light i.e. EUV light. An EUV mask 10 shown in FIG. 7(a) comprises a substrate 12, and a reflective layer 13 to reflect EUV light and an absorber layer 14 to absorb EUV light, formed in this order on the substrate. The reflective layer 13 is shown as a multilayer reflective film comprising high refractive index layers and low refractive index layers alternately stacked. Further, although not shown, in addition to the above structure, a protective layer to protect the reflective layer 13 at the time of patterning the absorber layer 14 is usually formed between the reflective layer 13 and the absorber layer 14, and a low reflective layer against an inspection light to be used for inspection of a mask pattern is usually formed on the absorber layer 14.

In the EUV mask 10 shown in FIG. 7(a), the right side in the drawing represents an absorber layer removed portion where the absorber layer 14 is removed so that the reflective layer 13 is exposed, and the left side in the drawing represents an absorber layer unremoved portion where the absorber layer 14 is not removed.

When EUV lithography is carried out, the EUV mask 10 is irradiated with EUV lights 30a, 30b and 30c from a direction inclined to the vertical direction by several degrees. What is originally intended as the contrast of reflected light on the EUV mask is a contrast between reflected light 31c from the absorber layer removed portion in the right side of the drawing and reflected light 31a from the absorber layer unremoved portion in the left side of the drawing. The reflected light 31a from the absorber layer unremoved portion sufficiently decayed when it passed through the absorber layer 14, and will not impair the contrast of the reflected light. FIG. 7(c) is a graph illustrating the intensity of reflected light at each portion on an ideal EUV mask from which only reflected light 31a and reflected light 31c are reflected.

However, since the EUV mask 10 is irradiated with EUV light from a direction inclined to the vertical direction by several degrees, EUV light which passed through only a part of the absorber layer 14 is reflected to constitute reflected light 31b. Such reflected light 31b has not sufficiently decayed, and accordingly with respect to the intensity of reflected light at each portion on the EUV mask, a gentle curve is drawn as shown in FIG. 7(b).

As evident from comparison between FIGS. 7(b) and 7(c), a decrease in the contrast of reflected light at the mask pattern boundary is inevitable with a conventional EUV mask. Such a decrease in the contrast of the reflected light occurs on each boundary of a mask pattern, and a decrease in the contrast of the reflected light at a boundary at the outer edge of a mask pattern, i.e. a boundary between a portion to be the outer edge of a mask pattern in the absorber layer removed portion and the absorber layer unremoved portion located outside and adjacent to the absorber layer removed portion to be the outer edge of the mask pattern, tends to be a major issue from the following reasons.

In a case where EUV lithography is carried out, a plurality of EUV masks of which the outer edges of mask patterns have the same shape are used with the transfer positions overlaid to carry out exposure. On that occasion, as the positions of the outer edges of the mask patterns are the same, and accordingly a decrease in the contrast of the reflected light at the boundaries on the outer edges of the mask patterns will repeatedly occur always at the same position on all the EUV masks. Accordingly, it is strongly desired to suppress a decrease in the contrast of reflected light at the boundaries on the outer edges of the mask patterns.

To solve the above problems of prior art, it is an object of the present invention to provide an EUV mask of which a decrease in the contrast of reflected light at the mask pattern boundary, particularly a decrease in the contrast of reflected light at the boundary on the outer edge of a mask pattern is suppressed, and an EUV mask blank to be used for production of the EUV mask.

Means to Solve the Problems

In order to accomplish the above object, the present invention provides
reflective mask blank for EUV lithography, comprising:
a substrate, and a reflective layer to reflect EUV light, and an absorber layer to absorb EUV light, formed in this order over the substrate,
a step on at least a part of the substrate being provided between a first portion where the absorber layer is removed at the time of patterning, and a second portion where the absorber layer is not removed at the time of patterning, adjacent to the first portion where the absorber layer is removed.

The present invention further provides a
reflective mask blank for EUV lithography, comprising:
a substrate, and a reflective layer to reflect EUV light and an absorber layer to absorb EUV light, formed in this order over the substrate,
a step on the substrate being provided between a first portion to be the outer edge of a mask pattern in a portion where the absorber layer is removed at the time of patterning, and a second portion where the absorber layer is not removed at the time of patterning, located outside and adjacent to the first portion to be the outer edge of a mask pattern.

In the EUV mask blank of the present invention, the height of the step is preferably from 2 to 10 nm.

In the EUV mask blank of the present invention, the step is provided preferably by forming a thin film on a part of the surface of the substrate.

In the EUV mask blank of the present invention, the step is provided preferably by removing a part of the surface of the substrate.

In the EUV mask blank of the present invention, a low reflective layer against an inspection light to be used for inspection of a mask pattern is preferably formed on the absorber layer.

In the EUV mask blank of the present invention, a protective layer to protect the reflective layer at the time of patterning may be formed between the reflective layer and the absorber layer.

In the EUV mask blank of the present invention, a mark for positioning is preferably formed on the outside of the exposure region at the time of patterning.

Still further, the present invention provides a reflective mask for EUV lithography, formed by patterning the above EUV mask blank of the present invention.

Effects of the Invention

Of the EUV mask of the present invention, a decrease in the contrast of reflected light at the mask pattern boundary is suppressed, and accordingly a transfer pattern formed on a resist on a substrate using the EUV mask is excellent in the shape accuracy and the dimensional accuracy.

The EUV mask of the present invention can be preferably prepared by using the EUV mask blank of the present invention.

MEANINGS OF SYMBOLS

Figure 1:
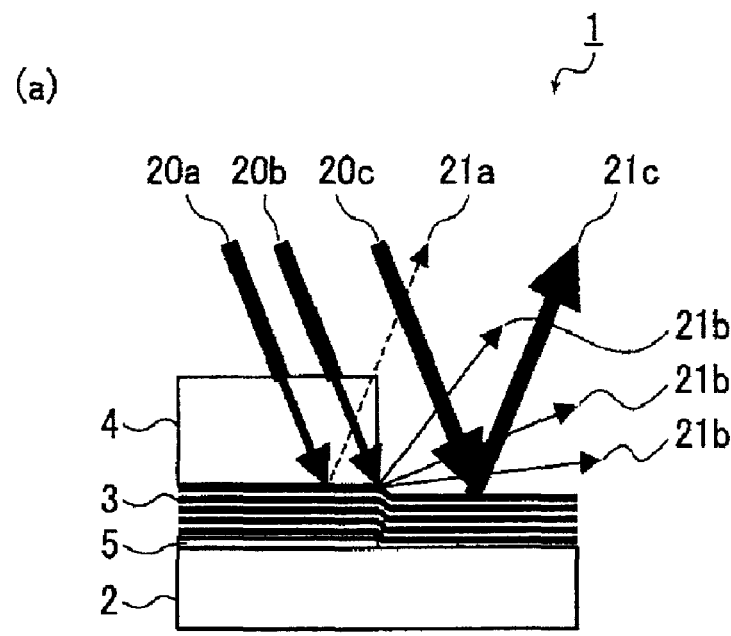
FIG. 1(a) is a view schematically illustrating one embodiment of an EUV mask of the present invention.
FIG. 1(b) is a graph illustrating the intensity of reflected light at each portion on the EUV mask shown in FIG. 1(a)
FIG. 1(c) is an enlarged view illustrating a step of the EUV mask shown in FIG. 1(a).
Figure 1:
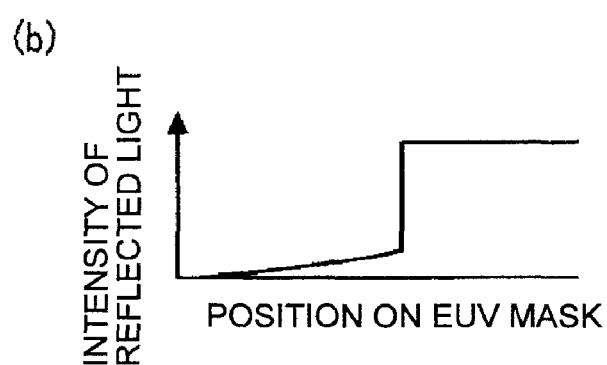
Figure 1:
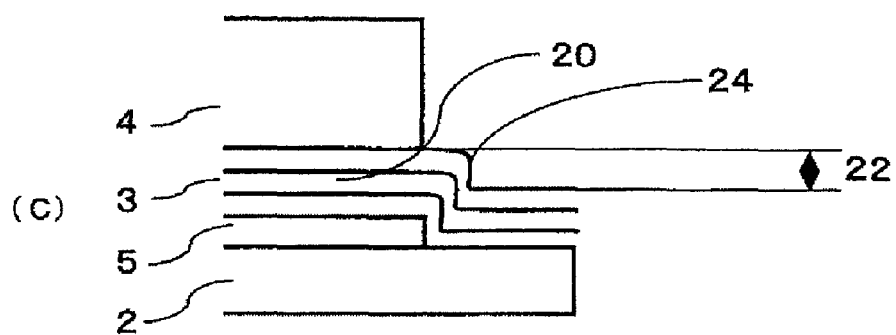

1: EUV mask
2: Substrate
3: Reflective layer
4: Absorber layer
5: Thin film
6: Mask pattern
7,8: Absorber unremoved portion
10: EUV mask 12: Substrate,
13: Reflective layer
14: Absorber layer
20: Step
22: Height of step
24: Edge surface of step

BEST MODE FOR CARRYING OUT THE INVENTION

Now, the EUV mask of the present invention will be described with reference to drawings.

FIG. 1(a) is a view schematically illustrating one embodiment of an EUV mask of the present invention.

Figure 7:
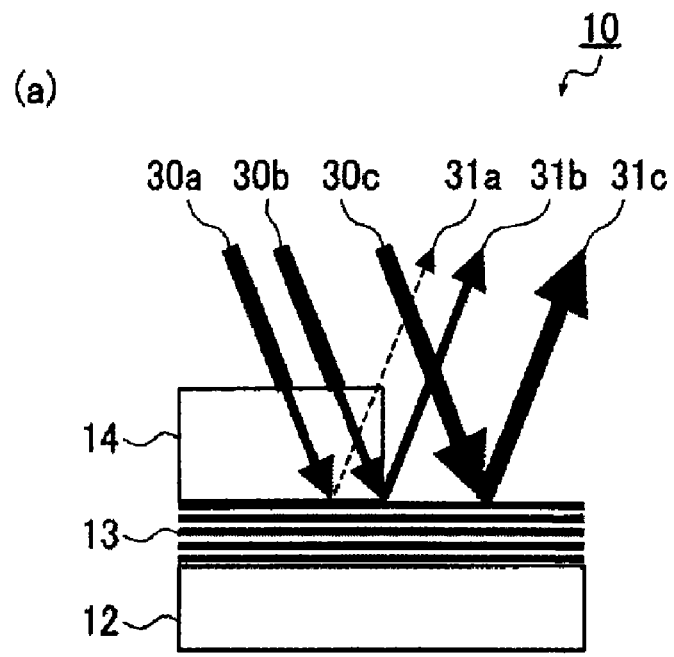
FIG. 7(a) is a view schematically illustrating one structure of an EUV mask.
FIG. 7(b) is a graph illustrating the intensity of reflected light at each portion on the EUV mask shown in FIG. 7(a)
FIG. 7(c) is a graph illustrating the intensity of reflected light at each portion on an ideal EUV mask on which only reflected light 31a and reflected light 31c are reflected.
Figure 7:
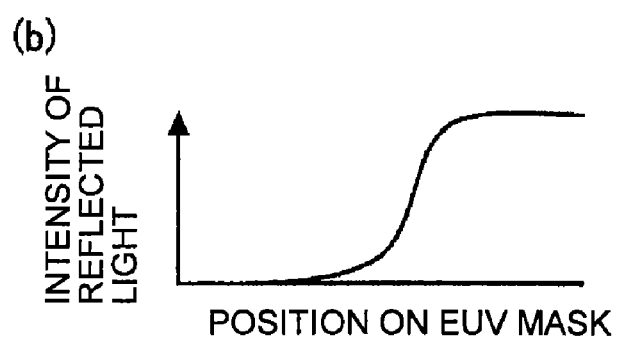
Figure 7:
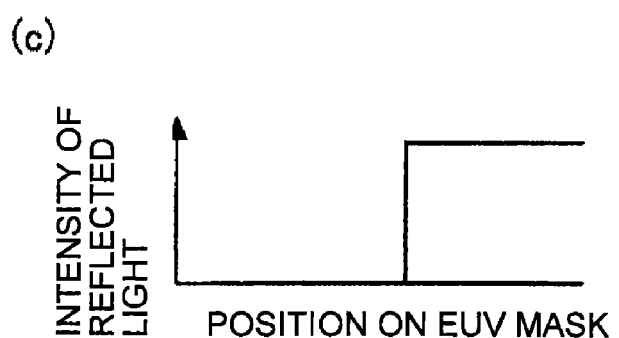

A mask 1 shown in FIG. 1(a) is the same as a conventional EUV mask shown in FIG. 7(a) in that a reflective layer 3 to reflect EUV light and an absorber layer 4 to absorb EUV light are formed in this order on a substrate 2, and that the right side in the drawing represents an absorber layer removed portion where the absorber layer 4 is removed so that the reflective layer 3 is exposed, and the left side in the drawing represents an absorber layer unremoved portion where the absorber layer 4 is not removed. However, in the EUV mask shown in FIG. 1(a), a step is provided between the absorber layer removed portion on the right side in the drawing and the absorber layer unremoved portion on the left side in the drawing. More specifically, a step is formed between a portion on the substrate 2 corresponding to the absorber layer removed portion and a portion on the substrate 2 corresponding to the absorber layer unremoved portion by forming a thin film 5 on a portion on the substrate 2 corresponding to the absorber layer unremoved portion. Hereinafter, in this specification, a step being formed between a portion on the substrate 2 corresponding to the absorber layer removed portion and a portion on the substrate 2 corresponding to the absorber layer unremoved portion adjacent to the above portion, will be referred to as "a step being formed at the mask pattern boundary on the substrate". Further, the step provided at the mask pattern boundary on the substrate will sometimes be simply referred to as "a step".

In the EUV mask of the present invention, a decrease in the contrast of reflected light at the mask pattern boundary can be suppressed by providing a step at the mask pattern boundary on the substrate.

On the EUV mask 1 of the present invention shown in FIG. 1 (a), a step is provided at the mask pattern boundary on the substrate 2, and accordingly the reflective layer 3 to be formed on the substrate 2 is formed along the step, and the reflective layer 3 has a structure with a deformed portion along the step. In a case where the EUV mask 1 having such a structure is irradiated with EUV lights 20a, 20b and 20c from a direction inclined to the vertical direction by several degrees, in formation of reflected light 21b by the EUV light 20b which passed through only a part of the absorber layer 4, the reflected light 21b is scattered and decays by the deformed portion present on the reflective layer 3. As a result, as shown in FIG. 1(b), a decrease in the contrast of reflected light at the mask pattern boundary is suppressed. FIG. 1(b) is a graph illustrating the intensity of reflected light at each portion on the EUV mask 1.

The height of the step required to obtain an effect of suppressing a decrease in the contrast of reflected light at the mask pattern boundary is influenced by thicknesses of the respective layers constituting the EUV mask 1, i.e. the thicknesses of the reflective layer 3 and the absorber layer 4, and further, the thickness of other layer usually formed on the EUV mask 1, such as a protective layer usually formed between the reflective layer 3 and the absorber layer 4 or a low reflective layer usually formed on the absorber layer 4. When the height of the step is at least 2 nm, so long as the thicknesses of such layers constituting the EUV mask 1 are within usual ranges, an effect of suppressing the decrease in the contrast of reflected light at the mask pattern boundary will be obtained.

On the other hand, a too great height of the step is unfavorable since it is necessary to increase the thickness of the absorber layer or the low reflective layer in order that the step will not appear on the surface of an EUV mask blank before it is formed into the EUV mask 1 by patterning the absorber layer, i.e. on the surface of the absorber layer of the EUV mask blank (in a case where a low reflective layer is formed on the absorber layer, on the surface of the low reflective layer). From this point of view, the height of the step is preferably at most 10 nm.

If the step appears on the surface of the absorber layer of the EUV mask blank (in a case where a low reflective layer is formed on the absorber layer, on the surface of the low reflective layer), a mask pattern to be formed on the absorber layer may be deformed. Further, as described hereinafter, in a case where a portion on the substrate 2 corresponding to the absorber layer unremoved portion is ground or etched to form a recessed portion thereby to form a step at the mask pattern boundary, if the step appears on the surface of the absorber layer of the EUV mask blank (in a case where a low reflective layer is formed on the absorber layer, on the surface of the low reflective layer), a region on which a shadow is cast on the mask pattern by exposure light will be increased at the time of EUV lithography.

The height of the step is more preferably from 2 to 7 nm, furthermore preferably from 3 to 5 nm.

The reason why a step is provided at the mask pattern boundary on the substrate in the EUV mask of the present invention is to suppress a decrease in the contrast of reflected light at the mask pattern boundary caused by irradiation of the EUV mask with EUV light from a direction inclined to the vertical direction by several degrees. Accordingly, the edge of the step and the mask pattern boundary do not necessarily agree with each other as shown in FIG. 1(a). For example, in the case of the EUV mask 1 shown in FIG. 1(a), it is possible to consider that a higher effect of scattering and weakening the reflected light 21b by the deformed portion present on the reflective layer 3 in formation of the reflected light 21b by EUV light 20b which passed through only a part of the absorber layer 4, is obtained when the edge of the step is positioned on the right side in the drawing (positioned on the absorber layer removed portion side) than the mask pattern boundary. Here, the edge of the step means an edge surface 24 of a step 20 formed on the substrate 2 as shown in FIG. 1(c), and in the same drawing, the symbol 22 represents the height of the step 20. From this point of view, an excellent effect of suppressing a decrease in the contrast of reflected light at the mask pattern boundary will be obtained when a step is provided so that the distance L between the edge of the step and the boundary of the mask pattern satisfies the following formula (1), where α (°) is the incidence angle of EUV lights 20a, 20b and 20c to the EUV mask 1, t (mm) is the thickness of the absorber layer 4 (in a case where a low reflective layer is formed on the absorber layer 4, the total thickness of the absorber layer and the low reflective layer), and h (nm) is the height of the step:

$$L=(t+h)\times\tan\alpha-h \quad (1)$$

Further, the positional relation of the edge of the step and the mask pattern boundary and the height of the step can be optimized by simulation. Usually, α is preferably several degrees, or from about 6 to about 8°. Further, t is preferably from 20 to 100 nm, more preferably from 25 to 90 nm, furthermore preferably from 30 to 80 nm. h is more preferably from 2 to 7 nm, furthermore preferably from 3 to 5 nm. L is preferably within the value determined by the above formula ±4 nm, particularly preferably within the value determined by the above formula ±2 nm.

Figure 2:
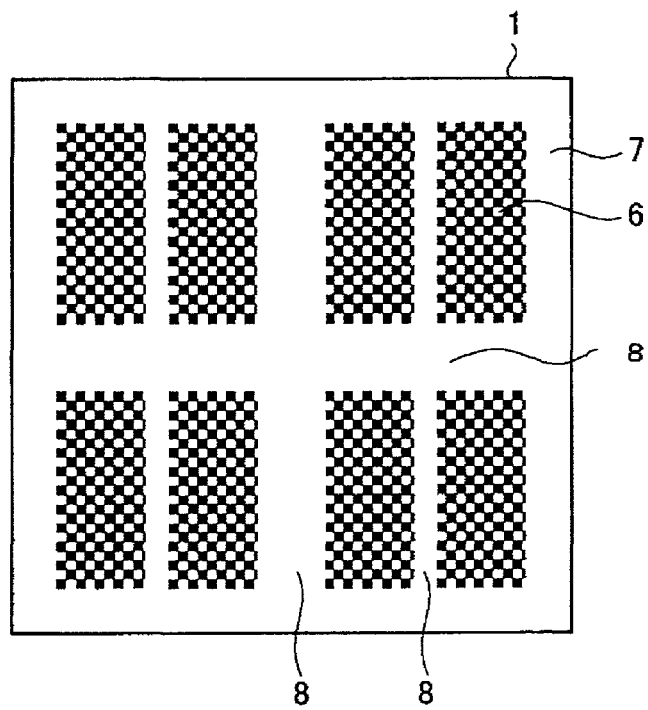
FIG. 2 is a plan view illustrating one example of an EUV mask.

FIG. 2 is a plan view illustrating one example of an EUV mask, and mask patterns 6 are formed on an EUV mask 1.

As described above, a decrease in the contrast of reflected light occurs at each boundary of each mask pattern 6, and a decrease in the contrast of reflected light at the boundary on the outer edge of each mask pattern is particularly problematic. That is, in the case of the EUV mask 1 shown in FIG. 2, a decrease in the contrast of reflected light between an absorber layer removed portion formed on the outermost side in the absorber layer removed portion constituting the mask pattern 6, and the absorber layer unremoved portion located outside and adjacent to the above absorber layer removed portion, i.e. an absorber layer unremoved portion 7 located on the outside of the mask pattern 6, is particularly problematic.

Accordingly, when a step is provided at the boundary between the mask pattern 6 and the absorber layer unremoved portion 7 in the EUV mask 1 of the present invention shown in FIG. 2 by forming a thin film on a portion on a substrate 2 corresponding to the absorber layer unremoved portion 7, a sufficient effect of suppressing a decrease in the contrast of reflected light at the mask pattern boundary will be obtained. This will be referred to as a first embodiment of the EUV mask of the present invention.

In addition to the first embodiment of the EUV mask of the present invention, when a step is provided at the boundary between the mask pattern 6 and an absorber layer unremoved portion 8 by forming a thin film on each portion on the substrate 2 corresponding to the absorber layer unremoved portion 8 present between the respective mask patterns 6 formed on the EUV mask 1, a still further improved effect of suppressing a decrease in the contrast of reflected light at the mask pattern boundary will be obtained. This will be referred to as a second embodiment of the EUV mask of the present invention.

In addition the second embodiment of the EUV mask of the present invention, by providing a step at each mask pattern boundary contained in each mask pattern 6 by forming a thin film on portions on the substrate 2 corresponding to the respective absorber layer unremoved portions constituting the mask pattern 6, a still further improved effect of suppressing a decrease in the contrast of reflected light will be obtained. This will be referred to as a third embodiment of the EUV mask of the present invention. The third embodiment of the EUV mask of the present invention is not necessarily intended to provide a step at all the mask pattern boundaries contained in each mask pattern 6 i.e. to form a thin film on portions on the substrate 2 corresponding to all the absorber layer unremoved portions constituting the mask pattern 6. For example, an effect of suppressing a decrease in the contrast of reflected light at the mask pattern boundary will sufficiently be obtained when a step is provided on portions which are particularly critical to the shape accuracy and the dimensional accuracy among the mask pattern boundaries contained in each mask pattern 6.

In the first embodiment of the EUV mask of the present invention, in a case where a thin film is formed on a portion on the substrate 2 corresponding to the absorber layer unremoved portion 7 shown in FIG. 2, a thin film should be formed in the vicinity of the boundary with the mask pattern 6 in the portion on the substrate 2 corresponding to the absorber layer unremoved portion 7, and it is not necessary to form a thin film to the outer edge of the EUV mask 1. In such a case, a thin film should be formed to a portion such that the distance L to the boundary of the mask pattern satisfies the above formula (1). In a case where the incidence angle α of EUV light is 6°, the height h of the step is 7 nm and the thickness t of the absorber layer is 70 nm, a thin film is formed to a range where the distance L to the boundary of the mask pattern 6 is about 7 nm, particularly about 10 nm, whereby an effect of suppressing a decrease in the contrast of reflected light at the mask pattern boundary will be sufficiently obtained. This applies to the second and third embodiments of the EUV mask of the present invention.

However, in view of easiness of formation of the thin film, it is preferred to form the thin film all over the portion on the substrate 2 corresponding to the absorber layer unremoved portion 7, to the outer edge of the EUV mask 1, on the EUV mask 1 shown in FIG. 2.

Further, formation of the thin film on the substrate 2 should be carried out at a stage of an EUV mask blank before it is formed into an EUV mask by patterning, more specifically, in production of the EUV mask blank.

The EUV mask blank of the present invention is a stacked member, to be patterned to obtain the EUV mask of the present invention. In relation to the EUV mask 1 shown in FIG. 1(*a*), a state where the absorber layer on the right side in the drawing on the EUV mask 1 has not been removed yet corresponds to an EUV mask blank. Accordingly, the above description regarding the EUV mask will be a description regarding the EUV mask blank of the present invention by replacing "the absorber layer removed portion" with "a portion where the absorber layer is removed at the time of patterning", and "the absorber layer unremoved portion" with "a portion where the absorber layer is not removed at the time of patterning, adjacent to the portion where the absorber layer is removed". The same applies to the following description regarding the EUV mask blank of the present invention.

As a method of forming a thin film on a portion on the substrate 2 corresponding to the absorber layer unremoved portion in accordance with the first to third embodiment in the EUV mask blank of the present invention, a method of using a mask having a desired shape and forming a thin film on only a portion on the substrate 2 corresponding to the absorber layer unremoved portion in accordance with the first to third embodiment, or a method of forming a thin film on the entire surface of the substrate 2 on the side on which a reflective layer is to be formed, i.e. the film deposition surface of the substrate 2, and removing a part of the thin film by etching to form the thin film on only a portion on the substrate 2 corresponding to the absorber layer unremoved portion in accordance with the first to third embodiment.

The material of the thin film to be formed on the substrate 2 is not particularly limited so long as the thin film after formed can be processed into a desired shape. However, in a case where the thin film is formed on the entire film deposition surface of the substrate 2, and then a part of the thin film is removed by etching thereby to form the thin film only on a portion on the substrate 2 corresponding to the absorber layer unremoved portion in accordance with the first to third embodiment, a sufficient etching selectivity between the thin film and the material of the substrate 2 is required.

From the above point of view, the material of the thin film is preferably CrN, Si, $SiO_2$, Ta or Mo. Among them, CrN, Si or $SiO_2$ is more preferred from the viewpoint of good processability, and CrN or Si is particularly preferred.

The method of forming the thin film on the substrate 2 by using such a material is not particularly limited, and a known film deposition method, for example, a sputtering method such as magnetron sputtering or ion beam sputtering, a CVD method, a vacuum deposition method of an electrolytic plating method may be mentioned. Among them, magnetron sputtering or ion beam sputtering is preferred with a view to forming a film with a uniform film thickness on a large area substrate.

In a case where a CrN film is formed as the thin film on the substrate 2, for example, magnetron sputtering is carried out under the following conditions.

Target: Cr target

Sputtering gas: Mixed gas of Ar and $N_2$ ($N_2$ gas concentration: 3 to 45 vol %, preferably 5 to 40 vol %, more preferably 10 to 35 vol %, gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Input electric power: 30 to 1,000 W, preferably 50 to 750 W, more preferably 80 to 500 W Film deposition rate: 2.0 to 60 nm/min, preferably 3.5 to 45 nm/min, more preferably 5 to 30 nm/min The thickness of the thin film formed on the substrate 2 is equal to the height of the step provided at the mask pattern boundary, and is preferably from 2 to 10 nm, more preferably from 2 to 7 nm, furthermore preferably from 3 to 5 nm. If the thin film is too thick, the shadow pattern (shadowing) will be increased, and accordingly the contrast may not sufficiently be improved.

The surface properties of the thin film formed on the substrate 2 preferably satisfy the surface properties required for the film deposition surface of the substrate 2 described hereinafter.

In the above described embodiment, the step is formed at the mask pattern boundary by forming the thin film on a portion on the substrate 2 corresponding to the absorber layer unremoved portion in accordance with the first to third embodiment. However, the method of forming the step at the mask pattern boundary is not limited thereto. For example, a step may be formed at the mask pattern boundary by grinding a portion on the substrate 2 corresponding to the absorber layer unremoved portion to form a recessed portion, or by etching the portion to form a recessed portion. In such a case, in the above description, the wording "a thin film is formed on a portion on the substrate 2 corresponding to the absorber layer unremoved portion" will be replaced with the wording "a portion on the substrate 2 corresponding to the absorber layer unremoved portion is partially ground to form a recessed portion" or "a portion on the substrate 2 corresponding to the absorber layer unremoved portion is etching to form a recessed portion".

Here, in a case where a portion on the substrate 2 corresponding to the absorber layer unremoved portion is partially ground to form a recessed portion, a known apparatus such as nm 450 (manufactured by RAVE LLC) may be used.

In a case where a portion on the substrate 2 corresponding to the absorber layer unremoved portion is etched to form a recessed portion, as the etching method, either wet etching or dry etching may be employed, but dry etching is preferably employed in view of high precision processing and excellent surface properties of the processed surface.

As drying etching, various dry etching methods such as ion beam etching, glass cluster ion beam etching or plasma etching may be employed.

The depth of the recessed portion formed on the substrate 2 is equal to the height of the step provided at the mask pattern boundary, and is preferably from 2 to 10 nm, more preferably from 2 to 7 nm, furthermore preferably from 3 to 5 nm. If the recessed portion is too deep, the shadow portion (shadowing) will be increased, and accordingly, the contrast may not sufficiently be improved.

The surface properties of the recessed portion preferably satisfy the surface properties required for the film deposition surface of the substrate 2 described hereinafter.

Now, the respective constituting elements of the EUV mask blank of the present invention will be described.

The substrate 2 is required to satisfy the characteristics as a substrate for an EUV mask blank. Therefore, the substrate 2 is preferably one which has a low thermal expansion coefficient (specifically, a thermal expansion coefficient at 20° C. of preferably $0\pm0.05\times10^{-7}/°$ C., particularly preferably $0\pm0.03\times10^{-7}/°$ C.) and which is excellent in smoothness, flatness and resistance against a cleaning liquid to be used for e.g. cleaning of the EUV mask blank or the EUV mask after patterning. Specifically, as such a substrate 2, glass having a low thermal expansion coefficient, such as a $SiO_2$—$TiO_2$ glass, may, for example, be used, but the substrate is not limited thereto, and a substrate of e.g. crystallized glass having β-quartz solid solution precipitated, quartz glass, silicon or metal, may also be used.

The substrate 2 preferably has a smooth surface having a surface roughness (rms) of at most 0.15 nm and a flatness of at most 100 nm, whereby a high reflectance and transfer precision can be obtained with the EUV mask after patterning.

The size, thickness, etc. of the substrate 2 are suitably determined depending upon the design values of the EUV mask, and as an example, one having a size of 6 inch (152 mm) square and a thickness of 0.25 inch (6.3 mm) may be mentioned.

It is preferred that no defects are present on the film deposition surface of the substrate 2. Even if they are present, in order that no phase defects will form by concave defects and/or convex defects, the depth of the concave defects and the height of the convex defects are preferably at most 2 nm, and the half value widths of such concave defects and convex defects are preferably at most 60 nm.

The reflective layer 3 is not particularly restricted so long as it is one having desired characteristics as a reflective layer for an EUV mask blank. Here, the characteristic particularly required for the reflective layer 3 is a high EUV light reflectance. Specifically, when the surface of the reflective layer 3 is irradiated with light in a wavelength region of EUV light at an incidence angle of 6°, the maximum value of the light reflectance in the vicinity of a wavelength of 13.5 nm is preferably at least 60%, more preferably at least 65%. Even in a case where a protective layer or a low reflective layer is formed on the reflective layer 3, the maximum value of the light reflectance in the vicinity of a wavelength of 13.5 nm is preferably at least 60%, more preferably at least 65%.

As the reflective layer 3, a reflective multilayer film having high refractive index layers and low refractive index layers alternately stacked in a plurality of times, is usually used as the reflective layer 3, whereby a high EUV light reflectance can be attained. In the reflective multilayer film constituting the reflective layer 3, Mo is widely used for the high refractive index layers, and Si is widely used for the low refractive index layers. That is, a reflective Mo/Si multilayer film is most common. However, the reflective multilayer film is not limited thereto, and a reflective Ru/Si multilayer film, a reflective Mo/Be multilayer film, a reflective Mo compound/Si compound multilayer film, a reflective Si/Mo/Ru multilayer film, a reflective Si/Mo/Ru/Mo multilayer film or a reflective Si/Ru/Mo/Ru multilayer film etc. may also be used.

The thicknesses and the number of repeating layer units of the respective layers constituting the reflective multilayer film constituting the reflective layer 3 may suitably be selected depending upon the film materials to be used and the EUV light reflectance required for the reflective layer. When a reflective Mo/Si multilayer film is taken as an example, in order to form a reflective layer 3 having the maximum value of the EUV light reflectance being at least 60%, the reflective multilayer film may be formed by stacking Mo layers having a thickness of 2.3±0.1 nm and Si layers having a thickness of 4.5±0.1 nm so that the number of repeating units will be from 30 to 60.

Here, the respective layers constituting the reflective multilayer film as the reflective layer 3 may be formed to have the desired thickness by means of a well-known film deposition method such as magnetron sputtering or ion beam sputtering.

For example, in a case where a reflective Si/Mo multilayer film is formed by means of ion beam sputtering, it is preferred that a Si film is deposited to have a thickness of 4.5 nm at an ion-accelerated voltage of from 300 to 1,500 V at a film deposition rate of from 0.03 to 0.30 nm/sec by using a Si target as the target and using an Ar gas (gas pressure: $1.3 \times 10^{-2}$ Pa to $2.7 \times 10^{-2}$ Pa) as the sputtering gas, and then a Mo film is deposited to have a thickness of 2.3 nm at an ion-accelerated voltage of from 300 to 1,500 V at a film deposition rate of from 0.03 to 0.30 nm/sec by using a Mo target as the target and using an Ar gas (gas pressure: $1.3 \times 10^{-2}$ Pa to $2.7 \times 10^{-2}$ Pa) as the sputtering gas. This operation is regarded as one cycle, and by stacking Si films and Mo films for 40 to 50 cycles, a reflective Si/Mo multilayer film will be formed.

In order to prevent oxidation of the surface of the reflective layer 3, the uppermost layer of the reflective multilayer film constituting the reflective layer 3 is preferably a layer made of a hardly oxidizable material. The layer made of a hardly oxidizable material will function as a cap layer of the reflective layer 3. As a specific example of the layer made of a hardly oxidizable material functioning as cap layer, a Si layer may, for example, be mentioned. In a case where the reflective multilayer film constituting the reflective layer 3 is a Si/Mo film, the uppermost layer may be made to be a Si layer, so that the uppermost layer will function as a cap layer. In such a case, the thickness of the cap layer is preferably 11±2 nm.

A protective layer may be provided between the reflective layer 3 and the absorber layer 4. The protective layer is provided for the purpose of protecting the reflective layer 3, so that the reflective layer 3 will not receive a damage by an etching process at the time of patterning the absorber layer 4 by an etching process, usually by a dry etching process. Accordingly, as the material for the protective layer, a material is selected which is hardly susceptible to an influence by the etching process of the absorber layer 4, i.e. a material having an etching rate slower than the absorber layer 4 and yet hardly susceptible to a damage by such an etching process. A material which satisfies such conditions, may, for example, be Cr, Al, Ta or their nitrides, Ru or a Ru compound (such as RuB or RuSi) as well as $SiO_2$, $Si_3N_4$, $Al_2O_3$ or a mixture thereof. Among them, Ru or a Ru compound (such as Ru or RuSi), CrN or $SiO_2$ is preferred, and Ru or a Ru compound (such as Ru or RuSi) is particularly preferred.

In a case where a protective layer is provided, its thickness is preferably from 1 to 60 nm.

In a case where a protective layer is provided, it is formed by using a well-known film deposition method such as magnetron sputtering or ion beam sputtering. In a case where a Ru film is formed by magnetron sputtering, it is preferred to carry out film deposition at an applied electric power of from 30 to 1,500 V at a film deposition rate of from 0.02 to 1.0 nm/sec so that the thickness will be from 2 to 5 nm by using a Ru target as the target and using an Ar gas (gas pressure: $1.0 \times 10^{-2}$ Pa to $10 \times 10^{-1}$ Pa) as the sputtering gas.

The characteristic particularly required for the absorber layer 4 is a sufficiently high contrast of reflected light in relation with the reflective layer 3 (in a case where a protective layer is formed on the reflective layer 3, in relation with the protective layer).

In this specification, the contrast of reflected light is obtained by the following formula:

$$\text{Contrast (\%) of reflected light} = ((R_2 - R_1)/(R_2 + R_1)) \times 100$$

wherein $R_2$ is the reflectance on the surface of the reflective layer 3 (in a case where a protective layer is formed on the reflective layer 3, on the surface of the protective layer) to the wavelength of EUV light, and $R_1$ is the reflectance on the surface of the absorber layer 4 (in a case where a low reflective layer against the wavelength of an inspection light is formed on the absorber layer 4, on the surface of the low reflective layer) to the wavelength of EUV light. The above $R_1$ and $R_2$ are measured in a state where a part of the absorber layer is removed by patterning as in the EUV mask 1 shown in FIG. 1(*a*). In a case where a low reflective layer is formed on the absorber layer, they are measured in a state where a part of the absorber layer and the low reflective layer on the EUV mask blank are removed by patterning. The above $R_2$ is a value measured on the surface of the reflective layer 3 (in a case where a protective layer is formed on the reflective layer 3, on the surface of the protective layer) exposed to the outside after the absorber layer 4 (in a case where a low reflective layer is formed on the absorber layer 4, the absorber layer 4 and the low reflective layer) is removed by patterning, that is, a value measured at the absorber layer removed portion on the right side in the drawing in the case of the EUV mask 1 shown in FIG. 1(*a*). The above $R_1$ is a value measured on the surface of the absorber layer 4 (in a case where a low reflective layer is formed on the absorber layer 4, on the surface of the low reflective layer) which is not removed by patterning and remains, i.e. a value measured at the absorber layer unremoved portion on the left side in the drawing in the case of the EUV mask 1 shown in FIG. 1(*a*).

The EUV mask blank and the EUV mask of the present invention preferably have a contrast of reflected light represented by the above formula of preferably at least 60%, more preferably at least 65%, particularly preferably at least 70%.

In order to achieve the above contrast of reflected light, the absorber layer 4 preferably has a very low EUV light reflectance. Specifically, when the surface of the absorber layer 4 is irradiated with light in a wavelength region of EUV light, the maximum light reflectance in the vicinity of a wavelength of 13.5 nm is preferably at most 0.5%, more preferably at most 0.1%.

In a case where a low reflective layer is formed on the absorber layer, when the surface of the low reflective layer is irradiated with light in a wavelength region of EUV light, the maximum light reflectance in the vicinity of a wavelength of 13.5 nm is preferably at most 0.5%, more preferably at most 0.1%.

In order to attain the above characteristics, the absorber layer 4 is made of a material having a high absorption coefficient of EUV light. As a material having a high absorption coefficient of EUV light, a material containing tantalum (Ta) as the main component is preferably used. In this specification, a material containing tantalum (Ta) as the main component means a material containing Ta in an amount of at least 40 at % (atomic %), preferably at least 50 at %, more preferably at least 55 at %.

The material containing Ta as the main component to be used for the absorber layer 4 may contain, in addition to Ta, at least one element selected from hafnium (Hf), silicon (Si), zirconium (Zr), germanium (Ge), boron (B) and nitrogen (N). Specifically, the material containing the above element in addition to Ta may, for example, be TaN, TaHf, TaHfN, TaBSi, TaBSiN, TaB, TaBN, TaSi, TaSiN, TaGe, TaGeN, TaZr or TaZrN.

However, the absorber layer 4 preferably contain no oxygen (O). Specifically, the O content in the absorber layer 4 is preferably less than 25 at %. At the time of patterning the absorber layer 4, usually dry etching process is employed, and as the etching gas, a chlorine gas (or a mixed gas containing a chlorine gas) or a fluorine gas (or a mixed gas containing a fluorine gas) is commonly used. In a case where a film containing Ru or a Ru compound is formed as a protective layer on the reflective layer for the purpose of preventing the reflective layer from being damaged by the etching process, a chlorine gas is mainly used as the etching gas in view of small damage on the protective layer. However, in the case of carrying out the drying etching process using a chlorine gas, if the absorber layer 4 contains oxygen, the etching rate will be decreased, and the resist damage will be increased, such being unfavorable. The content of oxygen in the absorber layer 4 is preferably at most 15 at %, more preferably at most 10 at %, furthermore preferably at most 5 at %.

The thickness of the absorber layer 4 is preferably from 20 to 100 nm, more preferably from 25 to 90 nm, furthermore preferably from 30 to 80 nm.

The absorber layer 4 having the above construction can be formed by using a known film deposition method, for example, a magnetron sputtering method or an ion bean sputtering method.

For example, in a case where a TaHf film as the absorber layer 4 is formed by employing a magnetron sputtering method, it may be formed under the following conditions.

Sputtering target: TaHf compound target (Ta=30 to 70 at %, Hf=70 to 30 at %)

Sputtering gas: Inert gas such as Ar gas (gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Degree of vacuum before film deposition: At most $1 \times 10^{-4}$ Pa, preferably at most $1 \times 10^{-5}$ Pa, more preferably at most $10^{-6}$ Pa Input electric power: 30 to 1,000 W, preferably 50 to 750 W, more preferably 80 to 500 W Film deposition rate: 2.0 to 60 nm/min, preferably 3.5 to 45 nm/min, more preferably 5 to 30 nm/min A low refractive layer against an inspection light may be formed on the absorber layer 4. In a case where a low reflective layer is formed, the low reflective layer is constituted by a film which shows a low reflectance against an inspection light to be used for inspection of a mask pattern. In the preparation of an EUV mask, after forming a pattern in the absorber layer, inspection is carried out to ascertain whether the pattern is formed as designed. In such an inspection of a mask pattern, an inspection machine is usually used wherein light of about 257 nm is used as an inspection light. That is, inspection is carried out by the contrast of reflected light in a wavelength region of about 257 nm. The absorber layer 4 of an EUV mask blank has an extremely low EUV light reflectance and thus has excellent characteristics as an absorber layer for an EUV mask blank 1, but when inspected with the wavelength of the inspection light, the light reflectance may not necessarily be said to be sufficiently low. As a result, no sufficient contrast may be obtained at the time of the inspection. If no sufficient contrast at the time of inspection is obtained, defects in the pattern cannot sufficiently be identified in the mask inspection, and no accurate inspection of defects can be carried out.

By forming a low reflective layer against an inspection light is formed on the absorber layer 4, the contrast at the time of inspection will be good, in other words, the light reflectance at the wavelength of the inspection light will be very low. Specifically, when the surface of the reflective layer is irradiated with light in a wavelength region of the inspection light, the maximum light reflectance at the wavelength of the inspection light is preferably at most 15%, more preferably at most 10%, further preferably at most 5%.

When the light reflectance of the low reflective layer at the wavelength of the inspection light is at most 15%, the contrast at the time of the inspection will be good. Specifically, the contrast of reflected light in a wavelength region of the inspection light determined by the above formula will be at least 30%.

In a case where a low reflective layer against an inspection light is formed on the absorber layer 4, the total thickness of the absorber layer 4 and the low reflective layer is preferably from 20 to 100 nm, more preferably from 25 to 90 nm, furthermore preferably from 30 to 80 nm.

Further, in the EUV mask blank 1 of the present invention, it is preferred to form the low reflective layer on the absorber layer 4, because the wavelength of light for inspection of a pattern is different from the wavelength of EUV light.

Accordingly, in a case where EUV light (in the vicinity of 13.5 nm) is used as light for inspection of a pattern, it is considered unnecessary to form a low reflective layer on the absorber layer 4. The wavelength of the inspection light tends to shift to the short wavelength side as the pattern dimension becomes small and in future, it may shift to 193 nm or further shift to 13.5 nm. When the wavelength of the inspection light is 13.5 nm, it will not be necessary to form the low reflective layer on the absorber layer 4.

The EUV mask blank 1 of the present invention may have a functional film known in the field of EUV mask blanks, in addition to the reflective layer 3 and the absorber layer 4, and optionally formed protective layer and low reflective layer. As a specific example of such a functional film, a high dielectric coating may be mentioned which is applied on the rear side of a substrate in order to accelerate electrostatic chucking of the substrate, as disclosed in e.g. JP-A-2003-501823. Here, in the EUV mask 1 shown in FIG. 1, the rear side of the substrate means the surface of the substrate 2 on the side opposite to the side on which the reflective layer 3 is formed. For the high dielectric coating to be provided on the rear side of the substrate for such a purpose, the electrical conductivity and the thickness of the constituting material are selected so that the sheet resistance will be at most 100Ω as measured in accordance with JIS K7194. The constituting material for the high dielectric coating may be selected widely from those disclosed in known literatures. For example, a high dielectric coating disclosed in JP-A-2003-501823, specifically, a coating comprising silicon, TiN, molybdenum, chromium or TaSi, may be applied. The thickness of the high dielectric coating may, for example, be from 10 to 1,000 nm.

The high dielectric coating may be formed by using a known film deposition method, for example, a sputtering method such as magnetron sputtering or ion beam sputtering, a CVD method, a vacuum deposition method or an electrolytic plating method.

In the present invention, a step provided by forming a thin film on the substrate or a step provided by forming a recessed portion on the substrate at the time of preparation of the EUV mask blank should agree with the mask pattern boundary formed by patterning the EUV mask blank. Accordingly, at the time of patterning the prepared EUV mask blank, the EUV mask blank should be accurately positioned. Accordingly, on the EUV mask blank of the present invention, a mark for positioning is preferably provided on the outside of the exposure region.

In the case of the substrate for an EUV mask blank, not the entire film deposition surface of the substrate is used for formation of the mask pattern. For example, in a case of a 152 mm square substrate, a region on which a resist film is to be formed is a 142 mm square region thereof, and the exposure region on which mask patterns are formed is a region of 132×104 mm thereof. By providing a mark for positioning on the outside of the exposure region on the EUV mask blank, the positional accuracy at the time of patterning the EUV mask will be improved, and it will be easy to make the step provided by forming a thin film on the substrate or a step provided by forming a recessed portion on the substrate agree with the mask pattern boundary formed by patterning the EUV mask blank.

In the EUV mask blank of the present invention, the shape, the size, the number, etc. of the mark for positioning provided on the outside of the exposure region are not particularly limited. For example, with respect to the shape, a cross is preferred since the direction of the mark can easily be identified. With respect to the size, in the case of a cross, the length of one side thereof is preferably at a level of 1,000 μm. With respect to the number, preferably three marks are provided since positioning can be carried out from the relative positions between the marks.

In the EUV mask blank of the present invention, the mark for positioning is required at the time of patterning the EUV mask blank, and the respective layers (the reflective layer, the protective layer, the absorber layer and the low reflective layer) constituting the EUV mask blank are usually formed on the entire film deposition surface of the substrate. Accordingly, the mark for positioning formed on the outside of the exposure region is required to be such that a step provided by forming a thin film on the substrate or a step provided by forming a recessed portion on the substrate at the time of formation of the reflective layer agrees with the mask pattern boundary formed by patterning the EUV mask blank. Accordingly, at the time of patterning the prepared EUV mask blank, the EUV mask blank should be accurately positioned. Accordingly, it is preferred that the mark for positioning is provided on the outside of the exposure region on the EUV mask blank of the present invention.

By at least patterning the absorber layer of the mask blank of the present invention, it is possible to prepare a mask. The method of patterning the absorber layer is not particularly limited, and for example, a method may be employed wherein the absorber layer is coated with a resist to form a resist pattern, which is used as a mask to etch the absorber layer. The material of the resist and the resist pattern lithography method may optionally be selected considering the material of the absorber layer, etc. The method of etching the absorber layer is also not particularly limited, and dry etching such as reactive ion etching or wet etching may be employed. After patterning the absorber layer, the resist is removed by a remover to obtain an EUV mask.

The process for producing a semiconductor integrated circuit employing the EUV mask according to the present invention will be described. The present invention is applicable to a process for producing a semiconductor integrated circuit by photolithography employing EUV light as a light source for exposure. Specifically, a substrate such as a silicon wafer coated with a resist is disposed on a stage, and the EUV mask is placed on a reflection type exposure apparatus constituted by combining reflecting mirrors. Then, the EUV mask is irradiated with EUV light from the light source by means of the reflecting mirrors so that the EUV light is reflected on the EUV mask, whereby the substrate coated with the resist is irradiated with the EUV light. By this pattern transfer step, the circuit pattern is transferred on the substrate. The substrate on which the circuit pattern is transferred is subjected to development so that the exposed portion or non-exposed portion is etched, and then the resist is removed. A semiconductor integrated circuit is prepared by repeatedly carrying out such steps.

EXAMPLES

Now, the present invention will be described in further detail with reference to Examples.

Example 1

Figure 3:
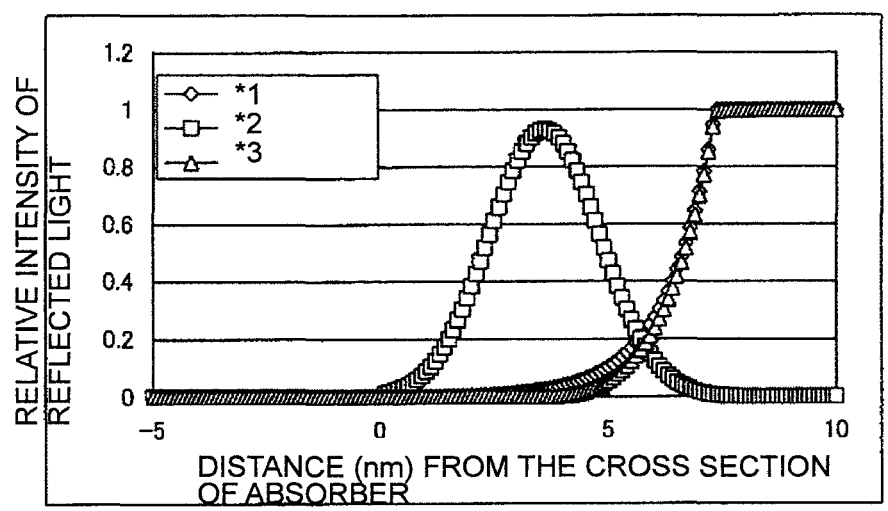
FIG. 3 is a graph illustrating the intensity of reflected light obtained in Example.

In Example 1, a simulation assuming a case where an EUV mask having a constitution as shown in FIG. 1(a) is irradiated with EUV light at an incidence angle of 6°, is carried out to obtain a graph illustrating the intensity of reflected light at each portion on the EUV mask as shown in FIG. 1(b). The results are shown in FIG. 3. The results shown in FIG. 3 are obtained by carrying out a simulation under the following conditions.

Reflective layer 3, absorber layer 4: Assumed reflective layer and absorber layer so that the contrast of reflected light will be 1,000:1

Thickness of absorber layer: 70 nm

Height of step: 7 nm

Distance between the edge of step and mask pattern boundary: 0 nm

Intensity of scattered light: All around total of intensity of scattered light scattered by the deformed portion present on the reflective layer, assuming a normal distribution curve with a standard deviation of about ⅕ of the distance from the edge of the step to the edge of the shadow of the absorber layer.

Intensity I of reflected light: Intensity of reflected light in a case where there is no scattering, assuming that light which has passed through the absorber layer decays in accordance with the Lambert-Beer's low.

Intensity S of reflected light: Intensity of reflected light having influences of scattering added, assuming that light which has passed through the absorber layer decays by scattering caused by the step.

The intensities I and S of reflected light are represented as the relative intensities where the intensity of reflected light is 1 when the EUV light is normally reflected on the surface of the reflective layer.

As evident from FIG. 3, as a result of providing a step at the mask pattern boundary, in formation of reflected light by EUV light which has passed through only a part of the absorber layer, the reflected light is scattered by the deformed portion present on the reflective layer, whereby suppression of a decrease in the contrast of reflected light at the mask pattern boundary is confirmed.

Example 2

Figure 4:
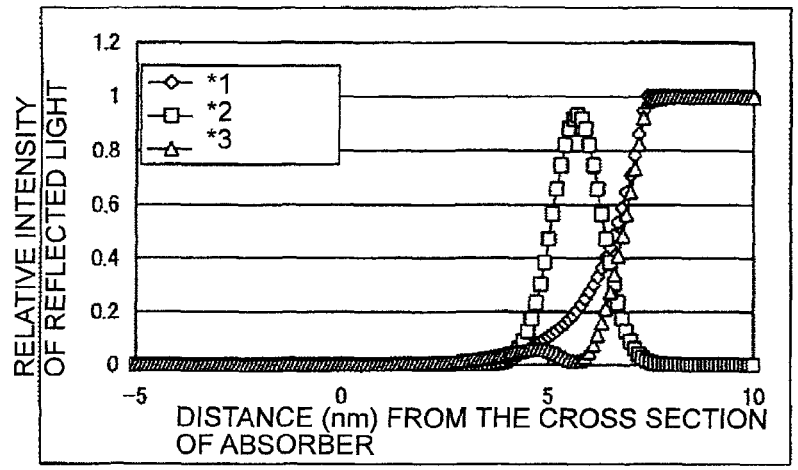
FIG. 4 is a graph illustrating the intensity of reflected light obtained in Example.

In FIG. 2, the same simulation as in Example 1 is carried out under conditions such that the height of the step is 4 nm and the edge of the step 5 in FIG. 1(a) is shifted to the right side in the drawing so that the distance between the edge of the step and the mask pattern boundary is 4 nm. FIG. 4 is a graph illustrating the intensity of reflected light at each portion on an EUV mask obtainable by the simulation.

As evident from FIG. 4, as a result of providing a step at the mask pattern boundary, in formation of reflected light by the EUV light which has passed through only a part of the absorber layer, the reflected light is scattered by the deformed portion present on the reflective layer, whereby an improvement in the contrast of reflected light at the mask pattern boundary is confirmed. As evident from the comparison between FIGS. 3 and 4, a higher effect of suppressing the contrast of reflected light is obtained in Example 2 than in Example 1.

Example 3

Figure 5:
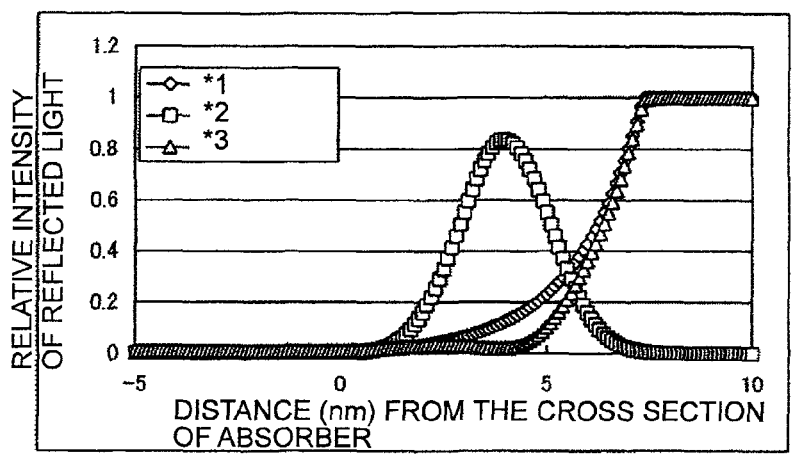
FIG. 5 is a graph illustrating the intensity of reflected light obtained in Example.

In Example 3, the same simulation as in Example 1 is carried out under conditions such that the reflective layer 3 and the absorber layer 4 are assumed reflective layer and absorber layer so as to achieve a contrast of reflected light of 100:1, the height of the step is 7 nm, and the edge of the step 5 in FIG. 1(a) is shifted to the right side in the drawing so that the distance between the edge of the step and the mask pattern boundary is 1 nm. FIG. 5 is a graph illustrating the intensity of reflected light at each portion of an EUV mask obtainable by the simulation.

As evident from FIG. 5, as a result of providing a step at the mask pattern boundary, in formation of reflected light by the EUV light which has passed through only a part of the absorber layer, the reflected light is scattered by the deformed portion present on the reflective layer, whereby an improvement in the contrast of reflected light at the mask pattern boundary is confirmed.

Example 4

Figure 6:
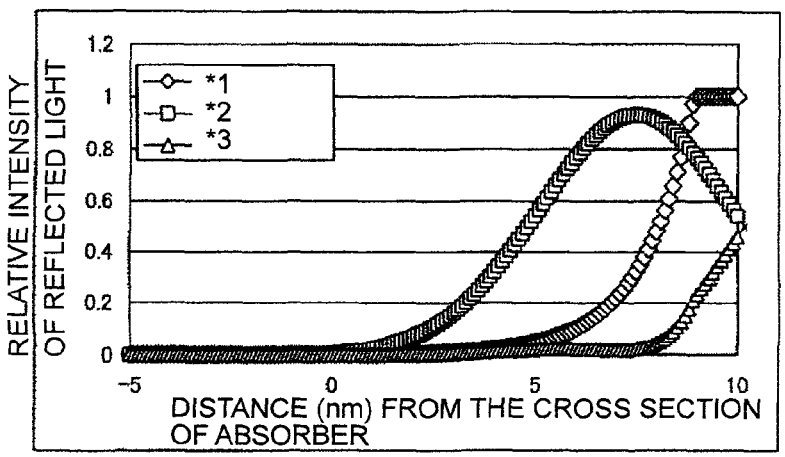
FIG. 6 is a graph illustrating the intensity of reflected light obtained in Example.

In Example 4, the same simulation as in Example 1 is carried out under conditions such that the reflective layer 3 and the absorber layer 4 are assumed reflective layer and absorber layer so as to achieve a contrast of the reflected light of 100:1, the height of a step is 15 nm, and the distance between the edge of the step and the mask pattern boundary is 0 nm. FIG. 6 is a graph illustrating the intensity of reflected light at each portion of an EUV mask obtainable by the simulation.

As evident from FIG. 6, as a result of providing a step at the mask pattern boundary, in formation of reflected light by the EUV light which has passed through only a part of the absorber layer, the reflected light is scattered by the deformed portion present on the reflective layer, whereby the contrast of reflected light at the mask pattern boundary is improved.

However, the increase in the reflected light is greater than in Examples 1 to 3 in which the height of the step is at most 10 nm than in Example 4. If the step is too high, the shadow portion (shadowing) is increased and as a result, the contrast may not sufficiently be improved.

INDUSTRIAL APPLICABILITY

The present invention is applicable to production of a high precision semiconductor as the EUV mask, etc.

The entire disclosure of Japanese Patent Application No. 2008-112763 filed on Apr. 23, 2008 including specification, claims, drawings and summary is incorporated herein by reference in its entirety.

What is claimed is:

1. A reflective mask blank for EUV lithography, comprising:
   a substrate;
   a reflective layer formed over the substrate and configured to reflect EUV light; and
   an absorber layer formed over the reflective layer and configured to absorb EUV light,
   wherein the reflective layer has a step portion forming a boundary between a first portion of the substrate where the absorber layer is removed at the time of patterning, and a second portion of the substrate where the absorber layer is not removed at the time of patterning, and the second portion of the substrate is adjacent to the first portion of the substrate.

2. The reflective mask blank for EUV lithography according to claim 1, wherein the step portion of the reflective layer has an edge which is on a side of the first portion than a boundary between the first portion and the second portion.

3. A reflective mask blank for EUV lithography, comprising:
   a substrate;
   a reflective layer formed over the substrate and configured to reflect EUV light; and
   an absorber layer formed over the reflective layer and configured to absorb EUV light,
   wherein the reflective layer has a step portion forming a boundary between a first portion of the substrate where the absorber layer is removed at the time of patterning, and a second portion of the substrate where the absorber layer is not removed at the time of patterning, the second portion of the substrate is adjacent to the first portion of the substrate, and the first portion of the substrate is configured to form an outer edge of a mask pattern.

4. The reflective mask blank for EUV lithography according to claim 3, wherein the step portion of the reflective layer has an edge which is on a side of the first portion than a boundary between the first portion and the second portion.

5. The reflective mask blank for EUV lithography according to claim 2, wherein a distance L between the edge of the step portion and a boundary of a mask pattern satisfies $L=(t+h)\times\tan\alpha-h$, where $\alpha$ (°) is an incidence angle of the EUV light to an EUV mask, t (mm) is a thickness of the absorber layer, and h (nm) is a height of the step portion.

6. The reflective mask blank for EUV lithography according to claim 1, wherein the step portion of the reflective layer has a height which is in a range of from 2 to 10 nm.

7. The reflective mask blank for EUV lithography according to claim 1, wherein the substrate has a thin film formed on a portion of a surface of the substrate, and the step portion of the reflective layer is formed by the thin film.

8. The reflective mask blank for EUV lithography according to claim 1, wherein the substrate has a portion formed by removing a part of the substrate, and the step portion of the reflective layer is formed by the portion of the substrate.

9. The reflective mask blank for EUV lithography according to claim 1, wherein a low reflective layer against an inspection light to be used for inspection of a mask pattern is formed on the absorber layer.

10. The reflective mask blank for EUV lithography according to claim 1, further comprising a protective layer configured to protect the reflective layer and formed between the reflective layer and the absorber layer.

11. The reflective mask blank for EUV lithography according to claim 1, further comprising a positioning mark formed on an outside of an exposure region.

12. A reflective mask for EUV lithography formed by patterning the reflective mask blank for EUV lithography as defined in claim 1.

13. A process for producing a semiconductor integrated circuit, comprising:

exposing an object using the reflective mask for EUV lithography as defined in claim 12 such that a semiconductor integrated circuit is formed on the object.

* * * * *